(12) United States Patent
Blahnik et al.

(10) Patent No.: US 8,497,486 B1
(45) Date of Patent: Jul. 30, 2013

(54) ION SOURCE HAVING A SHUTTER ASSEMBLY

(71) Applicant: Varian Semiconductor Equipment Associates, Inc., Gloucester, MA (US)

(72) Inventors: Jeffrey Charles Blahnik, Leander, TX (US); William T. Weaver, Austin, TX (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 0 days.

(21) Appl. No.: 13/651,685

(22) Filed: Oct. 15, 2012

(51) Int. Cl.
*H01J 49/10* (2006.01)
*H01J 37/317* (2006.01)
*H01J 27/02* (2006.01)
*H01J 3/07* (2006.01)

(52) U.S. Cl.
USPC ............... 250/423 R; 250/492.21; 250/492.3; 250/396 R; 250/398; 313/363.1; 315/111.31; 315/111.81

(58) Field of Classification Search
USPC .................. 250/423 R, 492.21, 492.3, 396 R, 250/398; 313/363.1; 315/111.31, 111.81
See application file for complete search history.

(56) References Cited

U.S. PATENT DOCUMENTS

| 7,748,344 B2 * | 7/2010 | DiVergilio et al. ...... 118/723 IR |
| 7,834,327 B2 * | 11/2010 | Regan ........................ 250/423 R |
| 8,089,052 B2 * | 1/2012 | Tieger et al. .............. 250/423 R |
| 8,101,927 B2 * | 1/2012 | Carlson et al. ........... 250/492.21 |

* cited by examiner

*Primary Examiner* — Nikita Wells

(57) ABSTRACT

An ion source includes arc chamber housing defining an arc chamber. The arc chamber housing has an extraction plate in a fixed position, and the extraction plate defines a plurality of extraction apertures. The ion source also includes a shutter assembly positioned outside of the arc chamber proximate the extraction plate. The shutter assembly is configured to block at least a portion of one of the plurality of extraction apertures during one time interval. The ion source combined with relative movement of a workpiece to be treated with an ion beam extracted from the ion source enables a two dimensional ion implantation pattern to be formed on the workpiece using only one ion source.

13 Claims, 4 Drawing Sheets

ION SOURCE HAVING A SHUTTER ASSEMBLY

FIELD

This disclosure relates to ion sources, and more particularly to an ion source having a shutter assembly.

BACKGROUND

A conventional ion source includes an extraction plate having one extraction aperture. Ions are extracted from the extraction aperture into a well defined ion beam. The extraction aperture may have a slit shape to extract an elongated ion beam generally referred to as a ribbon beam. The extraction aperture may have a circular shape to extract a generally circular shaped ion beam generally referred to as a spot beam. Many ion implant applications treat an entirety of a front surface of a workpiece with the ion beam where photoresist defines areas of the workpiece to be treated. In other ion implant applications not using photoresist, it is desirable to form a two dimensional pattern on the workpiece. In one example, the workpiece may be a solar cell such as a selective emitter solar cell where it is desirable to form an interlaced pattern of doped regions. These doped regions are located underneath contacts on the completed selective emitter solar cell to lessen contact resistance and hence improve the overall efficiency of the selective emitter solar cell (the percentage of light converted to electrical energy).

To create a two dimensional pattern, a plurality of ion sources where each has a single aperture may be positioned in assembly line so a workpiece may be scanned past each ion source in succession. In one example, three separate ion sources each having a different extraction apertures are necessary. The workpiece is scanned past the first ion source to create one particular doped pattern, then scanned past the second ion source to create another doped pattern, and then finally scanned past the third ion source to create yet another doped pattern which together created a desired two dimensional pattern. One drawback with this conventional arrangement is that it requires multiple ion sources and the accompanying expense and maintenance of each ion source. Another drawback is that it takes up additional space in an assembly area which has a premium on floor space.

Accordingly, there is a need in the art for an ion source and ion implanter that overcomes the above-described inadequacies and shortcomings.

SUMMARY

According to a one aspect of the disclosure, an ion source is provided. The ion source includes arc chamber housing defining an arc chamber, the arc chamber housing having an extraction plate in a fixed position, the extraction plate defining a plurality of extraction apertures. The ion source also includes a shutter assembly positioned outside of the arc chamber proximate the extraction plate. The shutter assembly is configured to block at least a portion of one of the plurality of extraction apertures during one time interval.

According to another aspect of the disclosure, an ion implanter is provided. The ion implanter includes an ion source, a shutter assembly, and a process chamber. The ion source has an arc chamber housing defining an arc chamber, the arc chamber housing having an extraction plate in a fixed position, the extraction plate defining a plurality of extraction apertures. The shutter assembly is positioned outside of the arc chamber proximate the extraction plate. The shutter assembly is configured to block at least a portion of one of the plurality of extraction apertures during one time interval. The processing chamber has a workpiece holder configured to hold and move the workpiece relative to an ion beam extracted from at least the portion of one of the plurality of extraction apertures to create a two dimensional ion implantation pattern on the workpiece, and the workpiece holder is spaced a distance downstream from the shutter assembly.

BRIEF DESCRIPTION OF THE DRAWINGS

For a better understanding of the present disclosure, reference is made to the accompanying drawings, in which like elements are referenced with like numerals, and in which.

DETAILED DESCRIPTION

Figure 1:
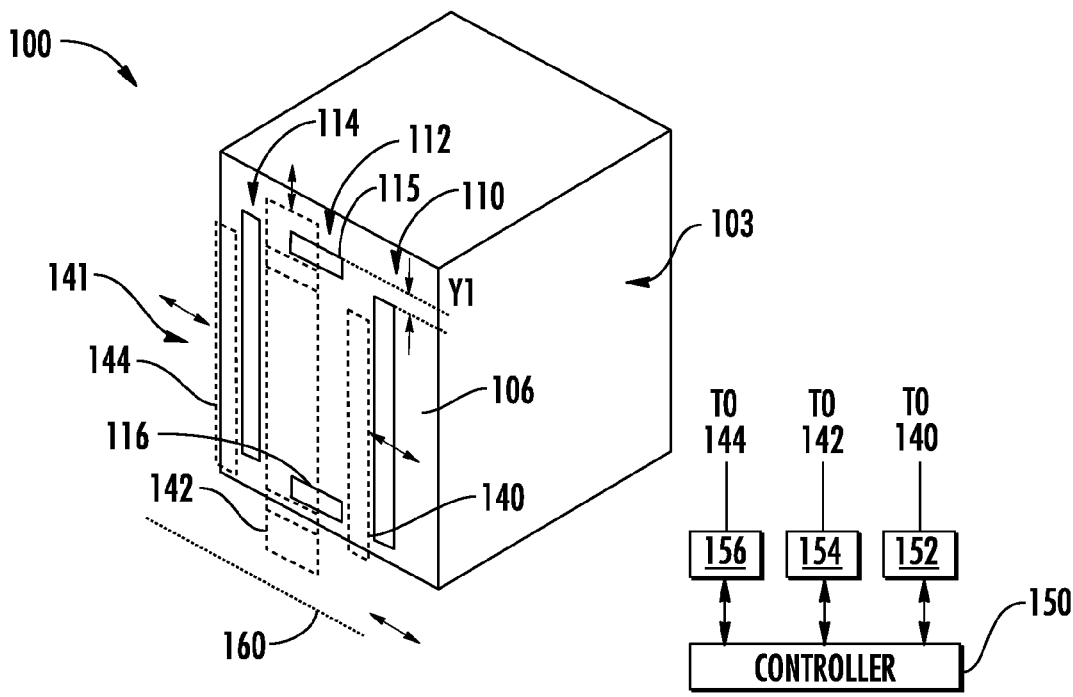
FIG. 1 is an exploded perspective view of an ion source consistent with the present disclosure.

The present invention will now be described more fully hereinafter with reference to the accompanying drawings, in which embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art. In the drawings, like numbers refer to like elements throughout.

Turning to FIG. 1, an exploded perspective view of an ion source 100 consistent with the present disclosure is illustrated. The ion source 100 includes an arc chamber housing 103 having an extraction plate 106. The arc chamber housing 103 defines an arc chamber 108 as more clearly illustrated in FIG. 2. The extraction plate 106 defines a plurality of extraction apertures. In the embodiment of FIG. 1, the extraction plate 106 defines a first extraction aperture 110, a second extraction aperture 112, and a third extraction aperture 114. The first and third extraction apertures 110, 114 have a slit like shape with the width of each exaggerated for clarity of illustration. In one embodiment, the first and third extraction apertures 110, 114 may have a length of about 160 mm and a width of about 2 mm. The third extraction aperture 114 may be offset a distance (Y1) along a long dimension direction compared to the first extraction aperture 110. The second extraction aperture 112 may include two openings 115, 116 having a long dimension orthogonal to the long dimension of the first and third extraction apertures 110, 114. Although three extraction apertures 110, 112, 114 having particular shapes are illustrated, those skilled in the art will recognize that other embodiments may have two or more extraction apertures having similar or differing shapes (e.g., circular, elliptical) and positions relative to one another.

The ion source 100 also includes a shutter assembly 141 positioned outside of the arc chamber 108. The shutter assembly 141 is configured to block at least a portion of one of the plurality of extraction apertures 110, 112, 114 during one time interval. The shutter assembly 141 may include a first shutter 140, a second shutter 142, and a third shutter 144 shown in phantom in an exploded view for clarity of illustration. Each shutter 140, 142, 144 may be fabricated of a material capable of blocking an ion beam (e.g., such as graphite or silicon coated aluminum) that would otherwise be extracted from the associated extraction apertures 110, 112, 114. Each shutter 140, 142, 144 may be positioned as close to the extraction plate 106 as possible but also to enable movement of the shutter 140, 142, 144. In one embodiment, each shutter 140, 142, 144 may be positioned within one millimeter of the extraction plate. A hinge mechanism may permit close contact of the shutter 140, 142, 144 to the extraction plate 106 when the shutters 140, 142, 144 are in a closed position but also enable movement of the shutters 140, 142, 144 away from the extraction apertures 110, 112, 114 during other times.

Each shutter 140, 142, 144 may also be independently controlled to control extraction of an ion beam from an associated extraction aperture 110, 112, 114 thus enabling creation of a variety of ion beam extraction patterns depending on which extraction apertures 110, 112, 114 or portions thereof are blocked at certain times. A first actuator 152 may control movement of the first shutter 140, a second actuator 154 may control movement of the second shutter 142, and a third actuator 156 may control movement of the third shutter 144. Each actuator 152, 154, 156 may be an electromechanical actuator having a motor, gear train, and linkage to control movement of each shutter 140, 142, 144 in a desired fashion. Each actuator 152, 154, 156 may be responsive to control signals from a controller 150.

The controller 150 can be or include a general-purpose computer or network of general-purpose computers that may be programmed to perform desired input/output functions. The controller 150 can also include other electronic circuitry or components, such as application specific integrated circuits, other hardwired or programmable electronic devices, discrete element circuits, etc. The controller 150 may also include communication devices, data storage devices, and software. The controller 150 may receive input signals from a variety of systems and components to determine a condition of one or more systems and components and also to control the same. For example, the controller 150 may independently control a position of each shutter 140, 142, 144 by controlling the actuators 152, 154, 156. The controller 150 may also control many other systems and components.

In operation, a dopant gas is input to the arc chamber 108 to be ionized. One example of dopant gas is $BF_3$. Plasma is created in the arc chamber 108 by ionizing the dopant gas. The ion source 100 may be any type of ion source such as an RF source having an RF generator and antenna to generate the plasma, or an indirectly heated cathode ion source where thermionic electrons are emitted from a cathode positioned in the arc chamber 108 to generate the plasma. Ions from the plasma may be extracted out one or more of the extraction apertures 110, 112, 114 into a well defined ion beam by known biasing techniques. The shutter assembly 401 may position one or more of the shutters 140, 142, 144 to block all or a portion of the ion beam that would otherwise be extracted from the extraction apertures 110, 112, 114. A workpiece such as a solar cell may be positioned on a workpiece plane 160 a distance (e.g., about 1 cm in one example) downstream of the extraction plate 106. The workpiece may be scanned along the workpiece plane in different directions to create a desired two dimensional implant pattern.

Figure 2:
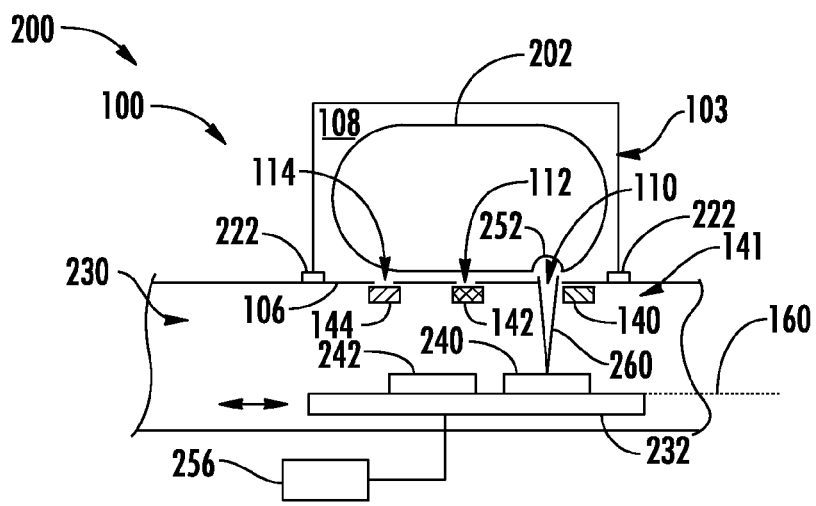
FIG. 2 is a cross sectional view of an ion implanter consistent with the present disclosure.

Turning to FIG. 2, a cross sectional view of an ion implanter 200 consistent with the disclosure is illustrated. The ion implanter 200 includes an ion source 100 consistent with FIG. 1 so similar parts are labeled similarly. The ion implanter 200 also includes a processing chamber 230 having a workpiece holder 232 configured to hold and move one or more workpieces 240, 242 relative to the extraction apertures 110, 112, 114. An insulator 222 electrically insulates the arc chamber housing 103 from the processing chamber 230. The extraction plate 106 may be fabricated of a material such as an insulator or semiconductor to modify a shape of a boundary 252 between a plasma 202 and a plasma sheath proximate an extraction aperture to control incident angles and a focus of an extracted ion beam.

In operation, a dopant gas is input to the arc chamber 108 to be ionized and plasma 202 is generated. A bias power supply 256 may provide a bias signal between the workpiece 240 and the arc chamber housing 103 to create an electric field for extraction of ions from the plasma 202 into a well defined ion beam. The bias signal may be a pulsed signal having pulse ON and pulse OFF time periods to bias the arc chamber housing 103 relative to the workpiece 240. In the embodiment of FIG. 2, the bias signal is applied to the workpiece and may be a negatively pulsed DC signal to attract positively charged ions. In other instances, the arc chamber housing 103 may be biased and the workpiece 240 grounded. In either instance, a focused ion beam 260 is extracted from the first extraction aperture 110 while the other extraction apertures 112, 114 are blocked by associated shutters 142, 144 during a time interval as illustrated in FIG. 2. The material selected for the extraction plate 106, the opening dimensions of the first extraction aperture 110, operating parameters of the plasma 202, and the distance of the workpiece plane 160 from the extraction plate 106 may be varied to impact the focus and implant angles of the focused ion beam 260. In one example, the extraction apertures 110 and 114 may have a slit like shape with a length of about 160 mm and a width of about 2 mm. The parameters may be tuned to enable the width of an implanted region to be reduced to about 100 μm at the workpiece. The workpiece holder 232 may move the workpieces 240, 242 in one or more directions through the focused ion beam 260. The shutter assembly 241 may control which extraction aperture 110, 112, 114 or portion thereof emits an ion beam by independently controlling the position of the shutters 140, 142, 144.

Figure 3:
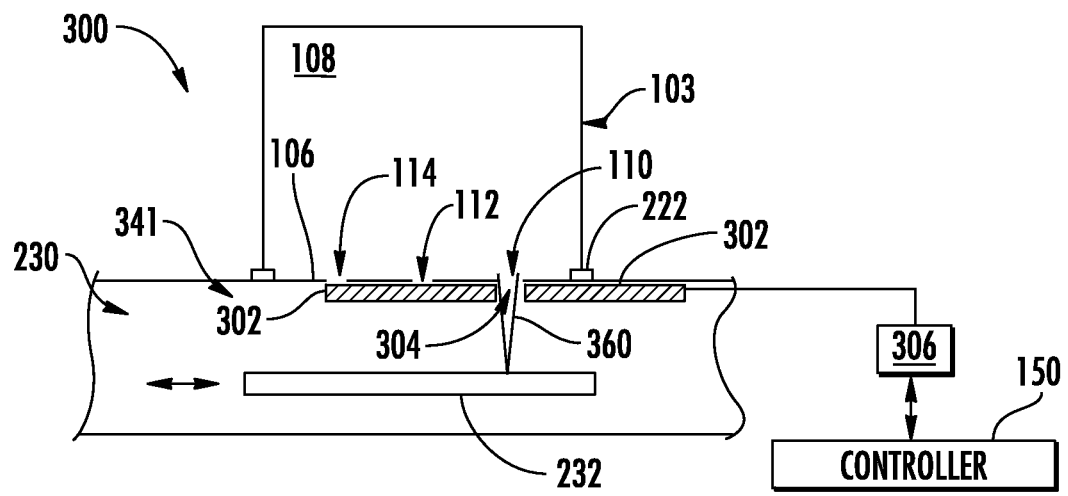
FIG. 3 is a cross sectional view of another ion implanter having a universal shutter plate.
Figure 4:
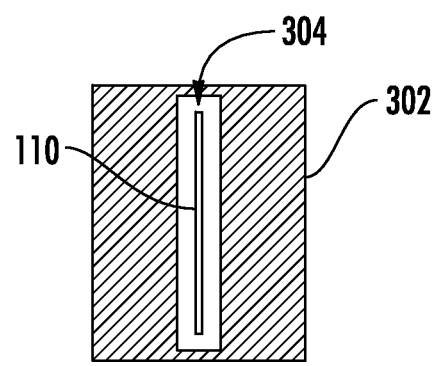
FIG. 4 is a front view of the universal shutter plate of FIG. 3.

Turning to FIG. 3 in conjunction with FIG. 4, a shutter assembly 341 may be configured with a single universal shutter plate 302 as opposed to a plurality of individually controllable shutters 140, 142, 144 previously detailed. The universal shutter plate 302 as more clearly shown in FIG. 4 defines a shutter aperture 304. An actuator 306 controlled by the controller 150 may control a position of the universal shutter plate relative to the extraction plate 106 and extraction apertures 110, 112, 114. The shutter aperture 304 may be sized and positioned to allow extraction of a first ion beam 360 from the first extraction aperture 110 during a first time interval while the universal shutter plate 302 blocks the other extraction apertures 112, 114. The shutter aperture 304 may be repositioned to allow a second ion beam to be extracted from the second extraction aperture 112 while blocking the first and third extraction apertures 110, 114. Finally, the shutter aperture 302 may be repositioned to allow a third ion beam to be extracted from the third extraction aperture 114 while blocking the first and second extraction apertures 110, 112.

Figure 5A:
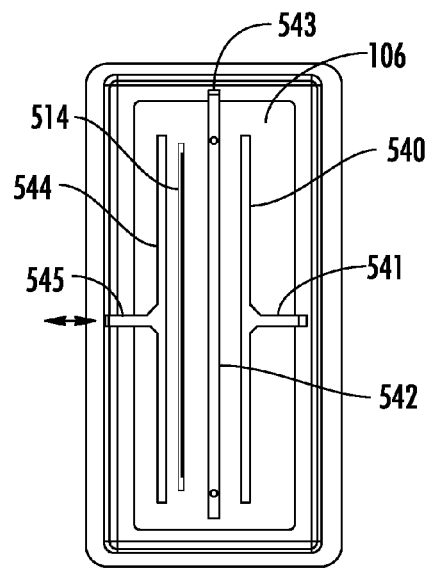
FIGS. 5A-5C are front views of another embodiment of an ion source having three shutters in different positions.
Figure 5B:
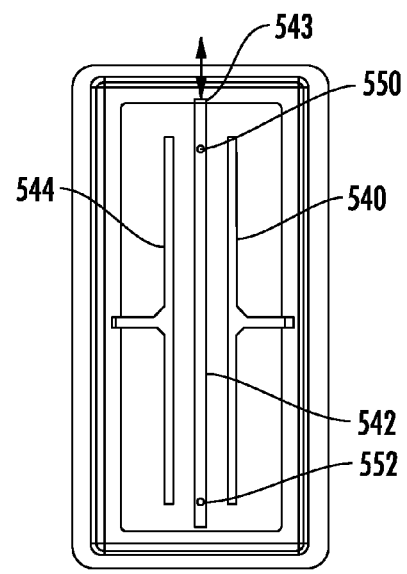
Figure 5C:
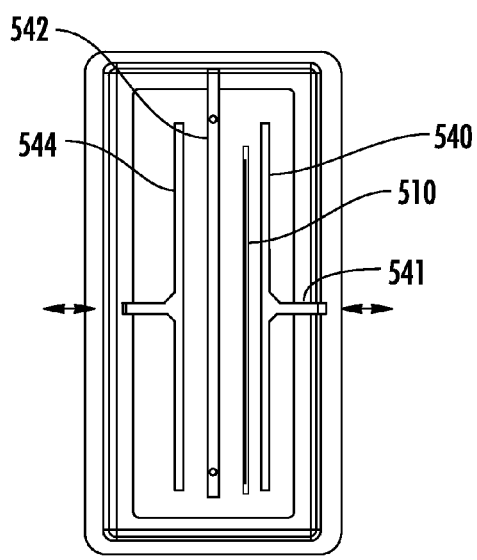

Turning to FIGS. 5A-5C, a front view of an extraction plate 106 and three separate shutters 540, 542, 544 in different positions is illustrated. In the view of FIG. 5A, the shutter 544 has an arm 545 to facilitate attachment to an associated actuator. The shutter 544 has been moved horizontally to the left to expose the underlying extraction aperture 514. The other two shutters 540, 542 are in a positioned to block associated underlying extraction apertures. Accordingly, in the positioning of FIG. 5A, an ion beam would be extracted from the extraction aperture 514 but not any other extraction apertures.

FIG. 5B illustrates the shutter 544 returned to its blocking position, with the center shutter 542 moved in a vertical direction to allow two underlying circular shaped extraction apertures 550, 552 to be exposed. The center shutter 542 may have a handle 543 to facilitate attachment to an associated actuator. Ion beams may be extracted from these extraction apertures 550, 552 while the other exit apertures are blocked. Finally, FIG. 5C illustrates yet another position with shutters 544, 542 in blocking positions and the right most shutter 540 moved in a horizontal direction to the right compared to its position in FIG. 5B in order to exposed the underlying slit shaped extraction aperture 510. The right most shutter 540 may have a handle 541 to facilitate attachment to an associated actuator.

Figure 6:
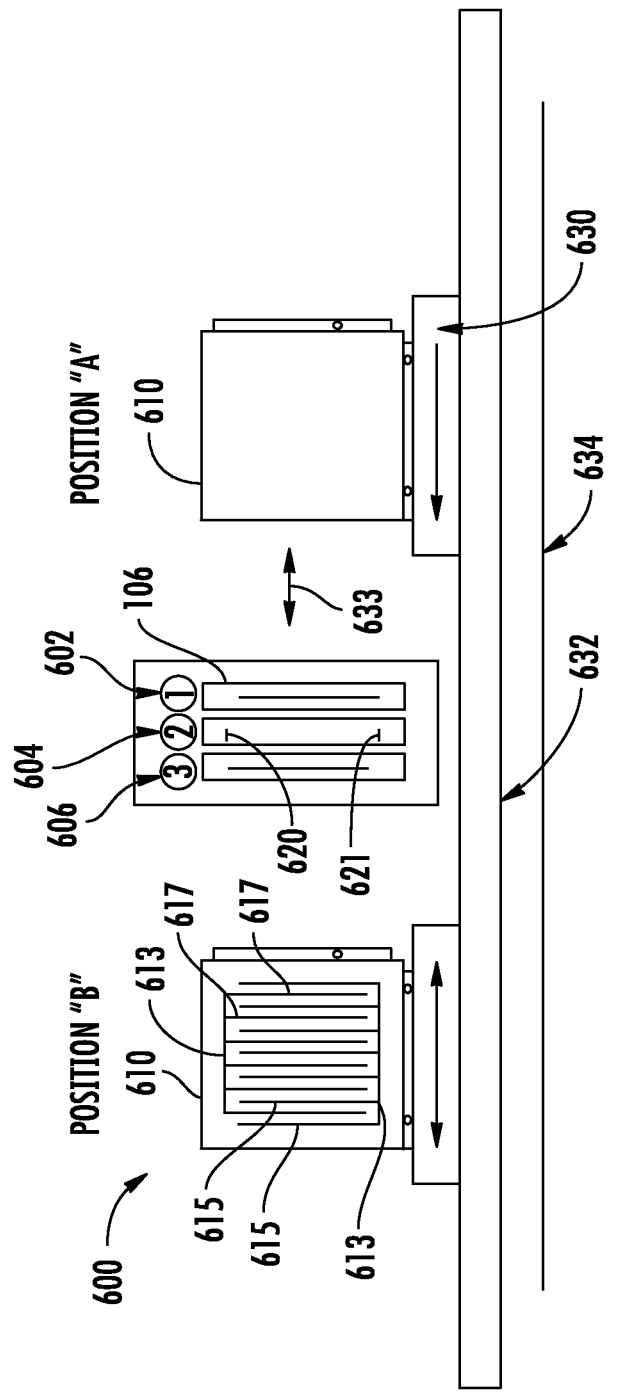
FIG. 6 is a schematic view of a two dimensional ion implant pattern that may be generated with an ion implanter consistent with the present disclosure.

Turning to FIG. 6, a view of one exemplary two dimensional ion implant pattern 600 is illustrated that may be generated by an ion source and ion implanter consistent with the present disclosure. A front view of an extraction plate 106 looing upstream in a direction of travel of an ion beam is illustrated. The extraction plate 106 has three separate extraction aperture regions 602, 604, 606. For convenience of illustration of the extraction aperture regions 602, 604, 606, the shutter assembly is not illustrated. A solar cell 610 to be implanted is illustrated in position A and a completed solar cell having a desired two dimensional implant pattern 600 is illustrated in position B. The solar cell may be clamped and supported by a workpiece holder 630. The workpiece holder 630 may be an electrostatic chuck to clamp the workpiece with electrostatic forces or a mechanical clamp to clamp the workpiece with mechanical forces. A linear motor stage 632 may support the workpiece holder 630 and facilitate scanning of the solar cell 610 in the direction of the arrow 633 back and forth through an ion beam extracted from a portion of one of the extraction aperture regions 602, 604, 606 or one or more of the entire extraction aperture regions 602, 604, 606. The linear motor stage 632 may rest on a mount surface 634.

In operation, to create the two dimensional ion implant pattern 600, the solar cell 610 may be moved to the left with aperture regions 604, 606 shuttered by a shutter assembly consistent with the disclosure and with aperture region 602 exposed. The ion beam output the ion source may be pulsed on and off and correlated to a scanned position of the solar cell 610 with respect to the aperture region 602 to implant a first pattern of vertical lines 615 spaced a predetermined distance from one another. The direction of scanning may then be reversed and the solar cell 610 may be driven to the right back through an ion beam extracted from the second extraction region 604 or a portion thereof while the other extraction regions 602, 606 are shuttered to generate a horizontal line implant pattern 613. For example, when first moving the solar cell 610 back to the right, the upper aperture 620 of the second aperture region 604 would be shuttered while the lower aperture 621 would be exposed, then bother the upper aperture 620 and lower aperture 621 would be exposed, and finally the upper aperture 620 would be shuttered with the lower aperture 621 exposed to create the horizontal line implant pattern 613. Finally, the solar cell 604 may be driven back to the left again and an ion beam may be output the third extraction region 606 while the other two extraction regions 602, 604 are shuttered. The ion beam output the ion source from this third extraction region 606 may be pulsed on and off and correlated to a scanned position of the solar cell 610 with respect to the aperture region 606 to implant a third pattern of vertical lines 617 spaced a predetermined distance from one another and interlaced between the first pattern of vertical lines 615. Rather than move back and forth through extraction aperture regions 602, 604, 606, the solar cell 610 may also be passed in only one direction with a shutter assembly having a plurality of shutters correlated to the scanned position of the solar cell 610 with respect to the extraction aperture regions 602, 604, 606. In this way, the two dimensional ion implant pattern 600 may be created in one pass. The solar cell 610 may be a selective emitter solar cell. Contact areas for the selective emitter solar cell may be positioned above the implanted regions to lessen contact resistance and hence improve the overall efficiency of the selective emitter solar cell.

Accordingly, there has been provided an ion source having a shutter assembly positioned outside the arc chamber proximate the extraction plate to block at least a portion of one of the plurality of extraction apertures during one time interval. An ion implanter having an ion source consistent with the disclosure is also provided. By controlling the shutter assembly as the workpiece is scanned past different extraction apertures, a variety of two dimensional ion implant patterns may be created using only one ion source. The use of multiple ion sources with the associated cost and maintenance of each may be avoided. In addition, the physical dimensions of the ion implanter are much smaller than that of one using multiple ion sources. Furthermore, the shutter assembly enables the extraction plate to remain fixed to arc chamber housing. Moving the extraction plate affects the plasma in the ion source and extremely tight tolerances makes it difficult to align any movable extraction plate without adversely influencing the characteristics of the ion beam extracted therefrom.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes.

What is claimed is:

1. An ion source comprising:
   arc chamber housing defining an arc chamber, the arc chamber housing having an extraction plate in a fixed position, the extraction plate defining a plurality of extraction apertures; and
   a shutter assembly positioned outside of the arc chamber proximate the extraction plate, the shutter assembly configured to block at least a portion of one of the plurality of extraction apertures during one time interval; wherein the shutter assembly comprises a plurality of shutters, each one of the plurality of shutters configured to control extraction of an ion beam from an associated extraction aperture of the plurality of extraction apertures.

2. The ion source of claim 1, wherein the shutter assembly comprises a first shutter configured to control extraction of a first ion beam from a first extraction aperture of the plurality of extraction apertures, a second shutter configured to control extraction of a second ion beam from a second extraction aperture of the plurality of extraction apertures, and a third shutter configured to control extraction of a third ion beam from a third extraction aperture of the plurality of extraction apertures, wherein each of the first, second, and third shutters are independently controllable and are positioned within one millimeter of the extraction plate.

3. The ion source of claim 2, wherein first shutter is positioned to enable the first ion beam to be extracted from the first extraction aperture during a first time interval while the second shutter is positioned to block an entirety of the second ion beam and the third shutter is positioned to block an entirety of the third ion beam during the first time interval.

4. The ion source of claim 1, wherein the shutter assembly comprises a single universal shutter plate defining a shutter aperture, and an actuator configured to move the single universal shutter plate to a first position relative to the extraction plate to enable a first ion beam to be extracted from a first extraction aperture of the plurality of apertures while blocking a remainder of the plurality of extraction apertures during a first time interval.

5. The ion source of claim 4, wherein the actuator is further configured to move the single universal shutter plate to a second position relative to the extraction plate to enable a second ion beam to be extracted from a second is extraction aperture of the plurality of apertures while blocking the remainder of the plurality of extraction apertures during a second time interval.

6. The ion source of claim 5, wherein the actuator is further configured to move the single universal shutter plate to a third position relative to the extraction plate to enable a third ion beam to be extracted from a third extraction aperture of the plurality of apertures while blocking the remainder of the plurality of extraction apertures during a third time interval.

7. An ion implanter comprising:
  an ion source having an arc chamber housing defining an arc chamber, the arc chamber housing having an extraction plate in a fixed position, the extraction plate defining a plurality of extraction apertures;
  a shutter assembly positioned outside of the arc chamber proximate the extraction plate, the shutter assembly configured to block at least a portion of one of the plurality of extraction apertures during one time interval wherein the shutter assembly comprises a plurality of shutters, each one of the plurality of shutters configured to control extraction of an ion beam from an associated extraction aperture of the plurality of extraction apertures; and
  a processing chamber having a workpiece holder configured to hold and move the workpiece relative to an ion beam extracted from at least the portion of one of the plurality of extraction apertures to create a two dimensional ion implantation pattern on the workpiece, the workpiece holder spaced a distance downstream from the shutter assembly.

8. The ion implanter of claim 7, wherein the workpiece comprises a selective emitter solar cell.

9. The ion implanter of claim 7, further comprising a bias power supply configured to provide a pulsed bias signal having pulse ON and pulse OFF time periods to bias the arc chamber housing relative to the workpiece, wherein the plurality of extraction apertures are configured to provide a focused ion beam there through during the pulse ON time periods of the pulsed bias signal.

10. The ion implanter of claim 7, wherein the shutter assembly comprises a first shutter configured to control extraction of a first ion beam from a first extraction aperture of the plurality of extraction apertures, a second shutter configured to control extraction of a second ion beam from a second extraction aperture of the plurality of extraction apertures, and a third shutter configured to control extraction of a third ion beam from a third extraction aperture of the plurality of extraction apertures, wherein each of the first, second, and third shutters are independently controllable and are positioned within one millimeter of the extraction plate.

11. The ion implanter of claim 7, wherein the shutter assembly comprises a single universal shutter plate defining a shutter aperture, and an actuator configured to move the single universal shutter plate to a first position relative to the extraction plate to enable a first ion beam to be extracted from a first extraction aperture of the plurality of apertures while blocking a remainder of the plurality of extraction apertures during a first time interval.

12. The ion implanter of claim 11, wherein the actuator is further configured to move the single universal shutter plate to a second position relative to the extraction plate to enable a second ion beam to be extracted from a second extraction aperture of the plurality of apertures while blocking the remainder of the plurality of extraction apertures during a second time interval.

13. The ion implanter of claim 12, wherein the actuator is further configured to move the single universal shutter plate to a third position relative to the extraction plate to enable a third ion beam to be extracted from a third extraction aperture of the plurality of apertures while blocking the remainder of the plurality of extraction apertures during a third time interval.

\* \* \* \* \*